United States Patent
Shen et al.

(10) Patent No.: US 10,720,335 B2
(45) Date of Patent: *Jul. 21, 2020

(54) CHEMISTRIES FOR TSV/MEMS/POWER DEVICE ETCHING

(71) Applicants: American Air Liquide, Inc., Fremont, CA (US); L'Air Liquide, Société Anonyme pour l'Etude et l'Exploitation des Procédés Georges Claude, Paris (FR); Air Liquide Electronics U.S. LP, Dallas, TX (US)

(72) Inventors: Peng Shen, Tsukuba (JP); Christian Dussarrat, Tokyo (JP); Curtis Anderson, Downingtown, PA (US); Rahul Gupta, St. Louis, MO (US); Vincent M. Omarjee, Versailles (FR); Nathan Stafford, Damascus, OR (US)

(73) Assignees: American Air Liquide, Inc., Fremont, CA (US); L'Air Liquide, Société Anonyme pour l'Etude et l'Exploitation des Procédés Georges Claude, Paris (FR); Air Liquide Electronics U.S. LP, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/114,371

(22) Filed: Aug. 28, 2018

(65) Prior Publication Data

US 2018/0366336 A1    Dec. 20, 2018

Related U.S. Application Data

(63) Continuation of application No. 15/699,668, filed on Sep. 8, 2017, now Pat. No. 10,103,031, which is a
(Continued)

(51) Int. Cl.
*H01L 21/3065* (2006.01)
*C09K 13/00* (2006.01)

(52) U.S. Cl.
CPC ........ *H01L 21/30655* (2013.01); *C09K 13/00* (2013.01)

(58) Field of Classification Search
None
See application file for complete search history.

(56) References Cited

U.S. PATENT DOCUMENTS 5,501,893 A    3/1996   Laermer et al.
6,284,148 B1   9/2001   Laermer et al.
(Continued)

FOREIGN PATENT DOCUMENTS

CN    103824767    5/2014
EP    2 733 725    5/2014
(Continued)

OTHER PUBLICATIONS

Chung, C.K. et al., "Novel monolithic micro droplet generator," NSTI-Nanotech 2004, ISBN 0-9728422-7-6, vol. 1, 367-370.
(Continued)

*Primary Examiner* — Ashok K Sarkar
(74) *Attorney, Agent, or Firm* — Yan Jiang

(57) ABSTRACT

Replacement chemistries for the $cC_4F_8$ passivation gas in the Bosch etch process and processes for using the same are disclosed. These chemistries have the formula $C_xH_yF_z$, with $1 \leq x < 7$, $1 \leq y \leq 13$, and $1 \leq z \leq 13$. The replacement chemistries may reduce RIE lag associated with deep silicon aperture etching.

17 Claims, 9 Drawing Sheets

Related U.S. Application Data continuation of application No. 15/316,932, filed as application No. PCT/JP2015/003044 on Jun. 17, 2015, now Pat. No. 9,892,932.

(60) Provisional application No. 62/013,959, filed on Jun. 18, 2014.

(56) References Cited

U.S. PATENT DOCUMENTS

| | | | |
|---|---|---|---|
| 6,284,666 | B1 | 9/2001 | Naeem et al. |
| 6,531,068 | B2 | 3/2003 | Laermer et al. |
| 6,569,774 | B1 | 5/2003 | Trapp |
| 6,900,136 | B2 | 5/2005 | Chung et al. |
| 9,892,932 | B2 * | 2/2018 | Shen .................. C09K 13/00 |
| 10,103,031 | B2 * | 10/2018 | Shen .................. C09K 13/00 |
| 2013/0105947 | A1 | 5/2013 | Fuller et al. |
| 2014/0077126 | A1 | 3/2014 | Benson et al. |
| 2014/0242803 | A1 | 8/2014 | Hibino et al. |

FOREIGN PATENT DOCUMENTS

| | | |
|---|---|---|
| JP | 2008 270348 | 11/2008 |
| JP | 2009 206444 | 9/2009 |
| WO | WO 2004 093176 | 10/2004 |
| WO | WO 2005 112092 | 11/2005 |
| WO | WO 2009 036053 | 3/2009 |
| WO | WO 2010 100254 | 9/2010 |
| WO | WO 2014 070838 | 5/2014 |
| WO | WO 2014 160910 | 10/2014 |
| WO | WO 2015 035381 | 3/2015 |
| WO | WO 2015 053339 | 4/2015 |

OTHER PUBLICATIONS

Kim, S.B. et al., "Characteristics of the post-etch polymer residues formed at the via hole and polymer removal using a semi-aqueous stripper," Journal of the Korean Physical Society, 49 (2006) 1991-1997.

Lai, S.L. et al., "Aspect ratio dependent etching lag reduction in deep silicon etch processes," JVST A 24, 2006, 1283-1288.

Owen, K.J. et al., "High aspect ratio deep silicon etching," IEEE, MEMS 2012, Paris, France, Jan. 29-Feb. 2, 2012, 251-254.

International Search Report and Written Opinion for corresponding PCT/JP2015/003044, dated Sep. 15, 2015.

* cited by examiner

(a) Polymer deposition rate

|        | Fragmant    | Percentage |
|--------|-------------|------------|
| c-C4F8 | C2F4 (100)  | 38%        |
|        | C3F5 (131)  | 31%        |
|        | CF (31)     | 14%        |
|        | CF3 (69)    | 11%        |
|        | CF2 (50)    | 4%         |
|        | C3F3 (93)   | 2%         |

|      | Fragmant   | Percentage |
|------|------------|------------|
| C3F6 | CF3 (69)   | 29%        |
|      | C3F5 (131) | 23%        |
|      | CF (31)    | 16%        |
|      | C2F4 (100) | 14%        |
|      | C3F6 (150) | 12%        |
|      | CF2 (50)   | 3%         |
|      | C2F3 (81)  | 3%         |

|       | Fragmant    | Percentage |
|-------|-------------|------------|
| C3HF5 | CF (31)     | 27%        |
|       | CF3 (69)    | 20%        |
|       | C3HF4 (113) | 13%        |
|       | CHCF (44)   | 11%        |
|       | C3HF5 (132) | 10%        |
|       | CHF2 (51)   | 8%         |
|       | CHCF2 (63)  | 6%         |
|       | CF2 (50)    | 5%         |

|          | Fragmant   | Percentage |
|----------|------------|------------|
| c-C4H2F6 | CF (31)    | 38%        |
|          | C2HF3 (82) | 20%        |
|          | CHF2 (51)  | 12%        |
|          | C2H2F2 (64)| 10%        |
|          | CF3 (69)   | 9%         |
|          | C3F3H2 (95)| 7%         |
|          | C2F4 (100) | 4%         |

|            | Fragmant     | Percentage |
|------------|--------------|------------|
| lin-C4H2F6 | CF (31)      | 25%        |
|            | CF3 (69)     | 22%        |
|            | C4H2F5 (145) | 18%        |
|            | C2H2 (26)    | 12%        |
|            | C4H2F6 (164) | 8%         |
|            | CHF2 (51)    | 8%         |
|            | C4HF6 (163)  | 7%         |

|       | Fragmant    | Percentage |
|-------|-------------|------------|
| C4HF7 | CF (31)     | 40%        |
|       | CHF2 (51)   | 23%        |
|       | CF3 (69)    | 17%        |
|       | CHF (32)    | 6%         |
|       | C3F5 (131)  | 5%         |
|       | CHCF (44)   | 5%         |
|       | C3HF4 (113) | 4%         |

FIG 8

CHEMISTRIES FOR TSV/MEMS/POWER DEVICE ETCHING

CROSS REFERENCE TO RELATED APPLICATIONS

The present application is a continuation of U.S. patent application Ser. No. 15/699,668 filed Sep. 8, 2017, which is a continuation of Ser. No. 15/316,932 filed Dec. 7, 2016 which is a 371 of International Application No. PCT/JP2015/003044 filed Jun. 17, 2015, which claims the benefit of U.S. Provisional Application Ser. No. 62/013,959 filed Jun. 18, 2014, herein incorporated by reference in its entirety for all purposes.

TECHNICAL FIELD

Replacement chemistries for the $cC_4F_8$ passivation gas in the Bosch etch process and processes for using the same are disclosed. These chemistries have the formula $C_xH_yF_z$, with $1 \leq x < 7$, $1 \leq y \leq 13$, and $1 \leq z \leq 13$ and preferably $2 \leq x < 4$ and $1 \leq y \leq 2$. The replacement chemistries reduce reactive ion etching lag (RIE lag) or aspect ratio dependent etching (ARDE).

BACKGROUND

Deep silicon etching is important for 3D integrated circuit (3D-IC) design, microelectronic machine systems (MEMS), and power device manufacturing. For 3D-IC, multi-dies (devices) will be stacked vertically to realize the "minimum size" of device. Deep etching aims to create the hole/via followed by filling conductive metal to realize communication between stacks (also called Through Silicon Via). For MEMS, different kinds of sensors have different structures with high aspect ratios. Power devices, such as super junction diodes, also need deep trench etching.

Deep reactive ion etching (DRIE) is used to form such high aspect ratio structures (normally >15:1 will be required for future technologies). The industry has adopted the switchable Bosch process, which cyclically supplies an etching gas ($SF_6$) followed by a sidewall passivation gas ($cC_4F_8$) (see, e.g., U.S. Pat. Nos. 5,501,893, 6,531,068, and 6,284,148). This process provides high selectivity and high etch rates. However, a non-uniform etching rate is observed between structures having different aspect ratios (also called RIE lag or aspect ratio dependent etching) due to the physical difficulty the ions/species have reaching the bottom of high aspect ratio holes/vias utilized in future technologies such as 3D-IC and MEMS. JVST A 24, 1283, 2006. The smaller size opening also makes deep etching more difficult. Owen et al., IEEE MEMS 2012. In other words, the higher aspect ratio and the narrower the hole, the slower etch rate using the Bosch process. Another disadvantage of Bosch process is that the polymer residue is difficult to remove after etching. Journal of the Korean Physical Society, 49 (2006) 1991-1997.

In current industry applications, especially MEMS, etch stop layers may be provided at the bottom of a silicon layer to physically reach same etch depth for different opening sizes. JVST A 24, 1283, 2006.

Another solution tunes the etching parameters. WO 2009/036053 to LAM Research Corp discloses changing substrate bias in the Bosch process as a solution of RIE lag. WO2009/036053 also replaces $SF_6$ in the Bosch process with $NF_3$ or $CHF_3$ and $cC_4F_8$ with $CF_4$.

US2013/105947 to Fuller et al. discloses a hydrofluorocarbon gas employed as a polymer deposition gas in an anisotropic etch process which alternates between use of an etchant gas and the polymer deposition gas to etch a deep trench in a semiconductor substrate.

WO2014/070838, having the same assignee as the present application, discloses etching fluids for plasma etching channel holes, gate trenches, staircase contacts, capacitor holes, contact holes, etc., in Si-containing layers on a substrate.

WO2014/160910 to DuPont discloses hydrofluoroolefin compositions useful for removing surface deposits in CVD chambers.

WO2015/035381, having the same assignee as the present application, discloses sulfur-containing compounds for plasma etching channel holes, gate trenches, staircase contacts, capacitor holes, contact holes, etc., in Si-containing layers and mask material.

U.S. Pat. No. 6,569,774 to Trapp (Micron) discloses a plasma etch process for forming a high aspect ratio contact opening through a silicon oxide layer using $C_xH_yF_z$ etch gases, wherein x is 1 to 2, y is 0 to 3, and z is 2x−y+2 or x is 3 to 6, y is 0 to 3, and z is 2x−y.

WO2010/100254 to Solvay Fluor GmbH discloses use of certain hydrofluoroalkenes for a variety of processes, including as an etching fluid for semiconductor etching or chamber cleaning. The hydrofluoroalkenes may include a mixture of at least one compound selected from each of the following groups a) and b):

a) (Z)-1,1,1,3-tetrafluorobut-2-ene, (E)-1,1,1,3-tetrafluorobut-2-ene, or 2,4,4,4-tetrafluorobut-1-ene, and b) 1,1,1,4,4,4-hexafluorobut-2-ene, 1,1,2,3,4,4-hexafluorobut-2-ene, 1,1,1,3,4,4-hexafluorobut-2-ene, and 1,1,1,2,4,4-hexafluorobut-2-ene.

A need remains for Bosch-type etching processes to form high aspect ratio apertures.

Notation and Nomenclature

Certain abbreviations, symbols, and terms are used throughout the following description and claims, and include:

As used herein, the indefinite article "a" or "an" means one or more.

As used herein, the terms "approximately" or "about" mean ±10% of the value stated.

As used herein, the term "etch" or "etching" refers to a plasma etch process (i.e., a dry etch process) in which ion bombardment accelerates the chemical reaction in the vertical direction so that vertical sidewalls are formed along the edges of the masked features at right angles to the substrate (Manos and Flamm, Plasma Etching An Introduction, Academic Press, Inc. 1989 pp. 12-13). The etching process produces apertures, such as vias, trenches, channel holes, gate trenches, staircase contacts, capacitor holes, contact holes, etc., in the substrate. The aperture has an aspect ratio defined as the ratio of the height to width (a 20:1 aspect ratio has a 20× height and a 1× width, wherein, preferably $1 \leq x \leq 5$ (see FIG. 5)).

The term "pattern etch" or "patterned etch" refers to etching a non-planar structure, for example by placing a patterned mask layer on a stack of metal- and/or silicon-containing layers and etching vias or trenches or the like in the areas not covered by the mask. The term "mask" refers to the layer that resists etching. The mask layer may be located above or below (the etch stop layer) the layer to be etched. The mask layer may be a hardmask, such as TiN or TaN, or a soft mask, such as a polymer or other organic "soft" resist materials. A "sacrificial mask" material is a material that is used to pattern a substrate and then removed.

The term "selectivity" means the ratio of the etch rate of one material to the etch rate of another material. The term "selective etch" or "selectively etch" means to etch one material more than another material, or in other words to have a greater or less than 1:1 etch selectivity between two materials.

As used herein, "—C", "=C" and ">C" refers to how that C is bonded to the remaining structure, with "—" being a single bond, "=" being a double bond, and ">" being a ring structure. For example, ">CHF" may refer to $cC_4H_5F_3$, wherein at least one C of the $C_4$ cyclic structure has a H and F substituent.

The standard abbreviations of the elements from the periodic table of elements are used herein. It should be understood that elements may be referred to by these abbreviations (e.g., S refers to sulfur, Si refers to silicon, H refers to hydrogen, etc.).

Please note that the Si-containing films, such as SiN and SiO, are listed throughout the specification and claims without reference to their proper stoichiometry. The silicon-containing layers may include pure silicon (Si) layers, such as crystalline Si, polysilicon (polySi or polycrystalline Si), or amorphous silicon; silicon carbide ($Si_oC_p$) layers; silicon nitride ($Si_kN_l$) layers; silicon oxide ($Si_nO_m$) layers; or mixtures thereof, wherein k, l, m, n, o, and p inclusively range from 1 to 6. Preferably, silicon nitride is $Si_kN_l$, where k and l each range from 0.5 to 1.5. More preferably silicon nitride is $Si_1N_1$. Preferably silicon oxide is $Si_nO_m$, where n ranges from 0.5 to 1.5 and m ranges from 1.5 to 3.5. More preferably, silicon oxide is $SiO_2$ or $SiO_3$. The silicon-containing layer may be silicon. Alternatively, the silicon-containing layer may be a silicon oxide based dielectric material such as organic based or silicon oxide based low-k dielectric materials such as the Black Diamond II or III material by Applied Materials, Inc. The silicon-containing layers may also include dopants, such as B, C, P, As and/or Ge.

SUMMARY

Disclosed are methods of etching apertures in silicon-containing substrates using cyclic processes. The silicon-containing substrate is plasma etched by an etching fluid containing fluorine to form an etched silicon-containing substrate. A polymer is deposited on the etched silicon-containing substrate by plasmas of a hydrogen-containing polymer deposition fluid. The cyclic plasma etching and polymer deposition steps are repeated.

Also disclosed are methods of etching apertures in silicon-containing substrates using a cyclic process. Once again, the silicon-containing substrate is plasma etched with an etching fluid containing fluorine to form an etched silicon-containing substrate. Plasma-treating a hydrogen-containing polymer deposition fluid produces $C_aH_bF_c$ species, wherein a=1 or 2, b=1 or 2, and c=1 to 3, wherein approximately 50% to approximately 100% of the total number of species have a C:F ratio greater than 1:2. The $C_aH_bF_c$ species deposit a polymer on the etched silicon-containing substrate. The plasma etching, plasma-treating and polymer deposition steps are repeated.

Either of the disclosed methods may include one or more of the following aspects:
 the silicon-containing substrate being silicon;
 the hydrogen-containing polymer deposition fluid having the formula $C_xH_yF_z$, with $1≤x<7$, $1≤y≤13$, and $1≤z≤13$;
 the hydrogen-containing polymer deposition fluid containing at least one of the following ligand selected from the group consisting of $=CH_2$, $=CF_2$, $=CFH$, $-CF_2H$, $CH_2F$, $>CHF$, and $>CH_2$;
 the hydrogen-containing polymer deposition fluid being trifluoroethylene;
 the hydrogen-containing polymer deposition fluid being (Z)-1,2,3,3,3-pentafluoropropene;
 the hydrogen-containing polymer deposition fluid being 1,1,2,3,3-pentafluoropropene;
 the hydrogen-containing polymer deposition fluid being 1,1,3,3,3-pentafluoropropene;
 the hydrogen-containing polymer deposition fluid being 1,2,3,3,3-pentafluoropropene;
 the hydrogen-containing polymer deposition fluid being (E)-1,2,3,3,3-pentafluoropropene;
 the hydrogen-containing polymer deposition fluid being 2,3,3,3-tetrafluoropropene;
 the hydrogen-containing polymer deposition fluid being (E)-1,3,3,3-tetrafluoropropene;
 the hydrogen-containing polymer deposition fluid being 1,1,3,3-tetrafluoropropene;
 the hydrogen-containing polymer deposition fluid being (Z)-1,3,3,3-tetrafluoropropene;
 the hydrogen-containing polymer deposition fluid being 1,3,3,3-tetrafluoropropene;
 the hydrogen-containing polymer deposition fluid being 1,1,2,3,3,4,4-heptafluorobut-1-ene;
 the hydrogen-containing polymer deposition fluid being 1,1,1,2,4,4,4-heptafluoro-2-butene;
 the hydrogen-containing polymer deposition fluid being heptafluorocyclobutane;
 the hydrogen-containing polymer deposition fluid being (Z)-1,1,1,2,3,4,4-heptafluoro-2-butene;
 the hydrogen-containing polymer deposition fluid being (E)-1,1,1,2,3,4,4-heptafluoro-2-butene;
 the hydrogen-containing polymer deposition fluid being 1,1,3,3,4,4,4-heptafluoro-1-butene;
 the hydrogen-containing polymer deposition fluid being 1,1,1,2,3,4,4-heptafluoro-2-butenel;
 the hydrogen-containing polymer deposition fluid being hexafluoroisobutylene;
 the hydrogen-containing polymer deposition fluid being cis-1,1,2,2,3,4-hexafluorocyclobutane;
 the hydrogen-containing polymer deposition fluid being trans-1,1,2,2,3,4-hexafluorocyclobutane;
 the hydrogen-containing polymer deposition fluid being hexafluoroisobutene;
 the hydrogen-containing polymer deposition fluid being 2,3,3,4,4,4-hexafluoro-1-butene;
 the hydrogen-containing polymer deposition fluid being 1,1,3,4,4,4-hexafluorobut-2-ene;
 the hydrogen-containing polymer deposition fluid being 3,3,4,4,4-pentafluorobutene-1;
 the hydrogen-containing polymer deposition fluid being 1,1,2,2,3-pentafluorocyclobutane;
 the hydrogen-containing polymer deposition fluid being 1,1,4,4,4-pentafluorobutene-1;
 the hydrogen-containing polymer deposition fluid being 1,1,2,3,3-pentafluorocyclobutane;
 the hydrogen-containing polymer deposition fluid being 3,3,4,4,4-pentafluoro-1-butene;
 the hydrogen-containing polymer deposition fluid being 2,4,4,4-tetrafluoro-1-butene;

the hydrogen-containing polymer deposition fluid being 1,1,2,2-tetrafluorocyclobutane;
the hydrogen-containing polymer deposition fluid being 3,3,4,4-tetrafluo-1-butene;
the hydrogen-containing polymer deposition fluid being 4,4,4-trifluoro-1-butene;
the hydrogen-containing polymer deposition fluid being 1,1,2-trifluorobut-1-ene;
the hydrogen-containing polymer deposition fluid being 2-(trifluoromethyl)propene;
the hydrogen-containing polymer deposition fluid being 1,1,difluoro-2-(fluoromethyl)cyclopropane;
the hydrogen-containing polymer deposition fluid being 1,2,3-trifluorocyclobutane;
the hydrogen-containing polymer deposition fluid being 1,1-difluorobutene;
the hydrogen-containing polymer deposition fluid being (2E)-1,4-difluoro-2-butene;
the hydrogen-containing polymer deposition fluid being (2E)-1,1-difluoro-2-butene;
the hydrogen-containing polymer deposition fluid being 1,1-difluoro-2-methyl-1-propene;
the hydrogen-containing polymer deposition fluid being nonafluorocyclopentane;
the hydrogen-containing polymer deposition fluid being 1,1,2,2,3,3-hexafluoro-4-(trifluoromethyl)cyclobutane;
the hydrogen-containing polymer deposition fluid being (1E)-1,2,3,3,4,4,5,5-nonafluoro-1-pentene;
the hydrogen-containing polymer deposition fluid being 1,1,3,3,4,4,5,5-nonafluoro-1-pentene;
the hydrogen-containing polymer deposition fluid being (2E)-1,1,1,2,3,4,4,5,5-nonafluoro-2-pentene;
the hydrogen-containing polymer deposition fluid being 1,3,3,4,4,5,5-heptafluorocyclopentene;
the hydrogen-containing polymer deposition fluid being 1,2,3,3,4,4,5-heptafluorocyclopentene;
the hydrogen-containing polymer deposition fluid being 3,3,4,4,5,5-hexafluorocyclopentene;
the hydrogen-containing polymer deposition fluid being hexafluorocyclopentene;
the hydrogen-containing polymer deposition fluid being pentafluoro(vinyl)cyclopropane;
the hydrogen-containing polymer deposition fluid being 1,2,3,3,4-pentafluorocyclopentene;
the hydrogen-containing polymer deposition fluid being 3,3,4,4-tetrafluoro-1-methylcyclobutene;
the hydrogen-containing polymer deposition fluid being 1,2,3-trifluoro-4-(trifluoromethyl)cyclobutane;
the hydrogen-containing polymer deposition fluid being 1,1,2,2,3-hexafluorocyclopentane;
the hydrogen-containing polymer deposition fluid being 1,1,2,2,3,3,4-heptafluorocyclopentane;
the hydrogen-containing polymer deposition fluid being 1,1,2,2,3,3,4,5-octafluorocyclopentane;
the hydrogen-containing polymer deposition fluid being octafluorocyclopentane;
the hydrogen-containing polymer deposition fluid being 1,1,4,4,4-pentafluoro-2-(trifluoromethyl)but-1-ene;
the hydrogen-containing polymer deposition fluid being (E)-1,1,1,2,3,4,5,5-octafluoropent-2-ene;
the hydrogen-containing polymer deposition fluid being 1,2,3,4,5-pentafluorocyclopentane;
the hydrogen-containing polymer deposition fluid being 3,3,4,4-tetrafluoro-2-methyl-1-butene;
the etching fluid being $SF_6$;
the etching fluid being $SF_5CF_3$;
the etching fluid being $SF_4$;
the etching fluid being $PF_3$;
the etching fluid being $Si_2F_6$;
the etching fluid being $BF_3$;
the etching fluid being $CF_3I$;
the etching fluid being $C_2F_5I$;
the etching fluid being $C_3F_7I$;
the etching fluid being $SOF_4$;
the etching fluid being $IF_5$;
the etching fluid being $COF_2$;
the aperture having an aspect ratio ranging from approximately 2:1 to approximately 100:1;
the aperture having a width ranging from approximately 40 nm to approximately 2000 um (microns or micrometers);
the silicon etching method selectively etching silicon more than silicon oxide;
the silicon etching method selectively etching silicon more than silicon nitride;
the silicon etching method not utilizing an inert gas;
the silicon etching method not utilizing an oxygen-containing gas; and
the oxygen-containing gas being ozone, oxygen, $H_2O$, $N_2O$, NO, and combinations thereof.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 8 are tables providing Q-MS analysis results at 70 eV of ionization energy for eight $C_xH_yF_z$ hydrogen-containing polymer deposition fluids, wherein x is 3 or 4, y is 0-2 and z is 8-5.

DESCRIPTION OF PREFERRED EMBODIMENTS

Figure 1:
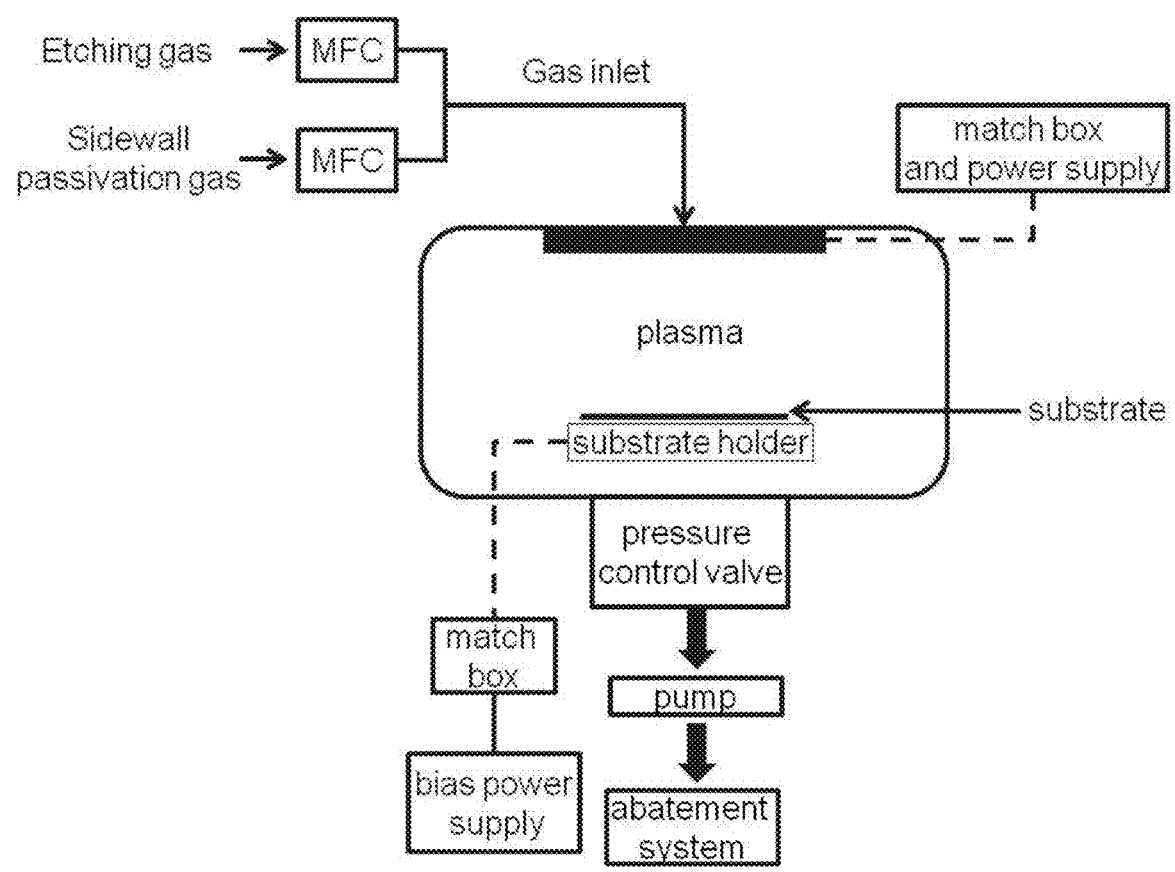
FIG. 1 is schematic diagram of an exemplary apparatus used to perform aperture etching.

Methods of etching apertures in silicon-containing substrates using a cyclic process are disclosed. As described above, the prior art cyclic process etches apertures in silicon substrates by introducing $SF_6$ as the etching gas and depositing a polymer on the aperture using $cC_4F_8$. Similar processes are described herein replacing the Bosch $cC_4F_8$ with a hydrogen-containing polymer deposition fluid. Applicants have found that the hydrogen-containing polymer deposition fluids permit etching of apertures having higher aspect ratios than those produced using $cC_4F_8$, which is important as technology progresses. Additionally, the hydrogen-containing polymer deposition fluids may permit etching of apertures having different aspect ratios at similar rates.

The disclosed methods plasma etch an aperture in a silicon-containing substrate using an etching fluid containing F to form an etched silicon-containing substrate and volatile $SiF_x$ gases, wherein x is 1-4. The etching fluid may be $SF_6$, $SF_5CF_3$, $SF_4$, $PF_3$, $Si_2F_6$, $BF_3$, $CF_3I$, $C_2F_5I$, $C_3F_7I$ and $SOF_4$, $IF_5$, $COF_2$, or combinations thereof. These fluids are commercially available. These etching fluids rapidly etch silicon from the substrate.

In one alternative, the etching fluid is $SF_6$, $SF_4$, $PF_3$, $Si_2F_6$, $BF_3$, $SOF_4$, $IF_5$, or combinations thereof, because these fluids contain no carbon atoms. The etching fluids containing carbon show lower etching rates as compared to those without carbon. The carbon atoms may also result in some film deposition.

The plasma of a hydrogen-containing polymer deposition fluid deposits a polymer on the etched silicon-containing substrate. The hydrogen-containing polymer deposition fluid has the formula $C_xH_yF_z$, with $1 \leq x < 7$, $1 \leq y \leq 13$, and $1 \leq z \leq 13$. The boiling point of the hydrogen-containing polymer deposition fluid should be less than approximately 50° C. at standard temperature and pressure. The hydrogen-containing polymer deposition fluid may have a cyclic structure and/or include a double bond. The cyclic structure and/or double bonds may make it easier to form a polymer film. Preferred hydrogen-containing polymer deposition fluids include at least one of the following substituents: =$CH_2$, =$CF_2$, =CHF, —$CH_2F$, —$CF_2H$, >CHF, or >$CH_2$.

Exemplary hydrogen-containing polymer deposition fluids include trifluoroethylene, (Z)-1,2,3,3,3-pentafluoropropene, 1,1,2,3,3-pentafluoropropene, 1,1,3,3,3-pentafluoropropene, 1,2,3,3,3-pentafluoropropene, (E)-1,2,3,3,3-pentafluoropropene, 2,3,3,3-tetrafluoropropene, (E)-1,3,3,3-tetrafluoropropene, 1,1,3,3-tetrafluoropropene, (Z)-1,3,3,3-tetrafluoropropene, 1,3,3,3-tetrafluoropropene, 1,1,2,3,3,4,4-heptafluorobut-1-ene, 1,1,1,2,4,4,4-heptafluoro-2-butene, heptafluorocyclobutane, (Z)-1,1,1,2,3,4,4-heptafluoro-2-butene, (E)-1,1,1,2,3,4,4-heptafluoro-2-butene, 1,1,3,3,4,4,4-heptafluoro-1-butene, 1,1,1,2,3,4,4-heptafluoro-2-butene, hexafluoroisobutylene, cis-1,1,2,2,3,4-hexafluorocyclobutane, trans-1,1,2,2,3,4-hexafluorocyclobutane, hexafluoroisobutene, 2,3,3,4,4,4-hexafluoro-1-butene, 1,1,3,4,4,4-hexafluorobut-2-ene, 3,3,4,4,4-pentafluorobutene-1,1,1,2,2,3-pentafluorocyclobutane, 1,1,4,4,4-pentafluorobutene-1,1, 1,2,3,3-pentafluorocyclobutane, 3,3,4,4,4-pentafluoro-1-butene, 2,4,4,4-tetrafluoro-1-butene, 1,1,2,2-tetrafluorocyclobutane, 3,3,4,4-tetrafluo-1-butene, 4,4,4-trifluoro-1-butene, 1,1,2-trifluorobut-1-ene, 2-(trifluoromethyl)propene, 1,1,difluoro-2-(fluoromethyl)cyclopropane, 1,2,3-trifluorocyclobutane, 1,1-difluorobutene, (2E)-1,4-difluoro-2-butene, (2E)-1,1-difluoro-2-butene, 1,1-difluoro-2-methyl-1-propene, nonafluorocyclopentane, 1,1,2,2,3,3-hexafluoro-4-(trifluoromethyl)cyclopentane, (1E)-1,2,3,3,4,4,5,5,5-nonafluoro-1-pentene, 1,1,1,3,3,4,4,5,5,5-nonafluoro-1-pentene, (2E)-1,1,1,2,3,4,4,5,5,5-nonafluoro-2-pentene, 1,3,3,4,4,5,5-heptafluorocyclopentene, 1,2,3,3,4,4,5-heptafluorocyclopentene, 3,3,4,4,5,5-hexafluorocyclopentene, hexafluorocyclopentene, pentafluoro(vinyl)cyclopropane, 1,2,3,3,4-pentafluorocyclopentene, 3,3,4,4-tetrafluoro-1-methylcyclobutene, 1,2,3-trifluoro-4-(trifluoromethyl)cyclobutane, 1,1,2,2,3,3-hexafluorocyclopentane, 1,1,2,2,3,3,4-heptafluorocyclopentane, 1,1,2,2,3,3,4,5-octafluorocyclopentane, octafluorocyclopentane, 1,1,4,4,4-pentafluoro-2-(trifluoromethyl)but-1-ene, (E)-1,1,1,2,3,4,5,5-octafluoropent-2-ene, 1,2,3,4,5-pentafluorocyclopentane, and 3,3,4,4-tetrafluoro-2-methyl-1-butene. These compounds are commercially available or synthesized by methods known in the art.

In one alternative, the hydrogen-containing polymer deposition fluids may be (Z)-1,2,3,3,3-pentafluoropropene, 1,1,2,3,3-pentafluoropropene, 1,1,3,3,3-pentafluoropropene, 1,2,3,3,3-pentafluoropropene, (E)-1,2,3,3,3-pentafluoropropene, 1,1,3,4,4,4-hexafluorobut-2-ene; 2,3,3,4,4,4-hexafluoro-1-butene; 1,1,2,3,3,4,4-heptafluorobut-1-ene, 1,1,1,2,4,4,4-heptafluoro-2-butene, cis-1,1,2,2,3,4-hexafluorocyclobutane, or combinations thereof.

In another alternative, the hydrogen-containing polymer deposition fluids may be (Z)-1,1,1,4,4,4-hexafluoro-2-butene; (E)-1,1,1,4,4,4-hexafluoro-2-butene; trans-1,1,2,2,3,4-hexafluorocyclobutane; hexafluoroisobutene; or combinations thereof.

The disclosed hydrogen-containing polymer deposition fluids are provided at greater than 99.9% v/v purity, preferably at greater than 99.99% v/v purity, and more preferably at greater than 99.999% v/v purity. The disclosed fluids contain less than 0.1% by volume trace impurities with less than 150 ppm by volume of nitrogen-containing and oxygen-containing fluids, such as $N_2$ and/or $H_2O$ and/or $CO_2$, contained in said trace impurities. Preferably, the water content in the fluid is less than 20 ppm by weight. The purified product may be produced by distillation and/or passing the gas or liquid through a suitable adsorbent, such as a 4 A molecular sieve.

In one embodiment the disclosed hydrogen-containing polymer deposition fluid contains less than 5% v/v, preferably less than 1% v/v, more preferably less than 0.1% v/v, and even more preferably less than 0.01% v/v of any of its isomers. This embodiment may provide better process repeatability. This embodiment may be produced by distillation of the gas or liquid. In an alternate embodiment, the disclosed hydrogen-containing polymer deposition fluid may contain between 5% v/v and 50% v/v of one or more of its isomers, particularly when the isomer mixture provides improved process parameters or isolation of the target isomer is too difficult or expensive. For example, a mixture of isomers may reduce the need for two or more gas lines to the plasma reactor.

Approximately 50% to approximately 100% of the total number of $C_aH_bF_c$ species produced by the plasma of the hydrogen-containing polymer deposition fluid have a C:F ratio greater than 1:2, wherein a=1 or 2, b=1 or 2, and c=1 to 3. The $C_aH_bF_c$ species form the polymer on the etched silicon-containing substrate. These small $C_aH_bF_c$ species may help form denser films when compared to films formed by larger species ($C_3$+). Dense films are more resistant to etching from the etching fluid because each unit area contains more atoms to react with the etching fluid. Hydrogen is also necessary in the small $C_aH_bF_c$ species and the resulting dense film. The H atom in the film reacts with the etching fluid during the etch process, permitting the C and F atoms to remain in the polymer film.

As illustrated in the following examples, QMS testing indicates that the majority (i.e., between approximately 50 atomic % and approximately 100 atomic %, more particularly between approximately 60 atomic % and approximately 96 atomic %) of the $C_aH_bF_c$ species produced by some of the proposed hydrogen-containing polymer deposition fluids have a C:F ratio greater than 1:2. The $C_aH_bF_c$ species having a C:F ratio greater than 1:2 may help form dense polymer films. The dense polymer films produced by the proposed $C_aH_bF_c$ species are not easily etched from the structures. The $C_aH_bF_c$ species form thinner dense polymer films on high aspect ratio structures (e.g., >15:1) than on low aspect ratio structures (e.g. <5:1) due at least to the physical difficulty the ions/species have reaching the bottom of high aspect ratio holes/vias. As will be illustrated in the examples that follow, the RIE lag or aspect ratio dependent etching may therefore be reduced over prior art processes by using the proposed hydrogen-containing polymer depositions fluids because more time will be needed to etch the thicker dense film produced on the low aspect ratio structures than those produced using the current deposition fluids. As a result, the etching time of the low aspect ratio structure may be similar to the etching time of the thinner films produced in the high aspect ratio structures. Preferably, the $C_aH_bF_c$ species also include H, which may consume F from the etch fluid providing further etch resistance.

The $C_aH_bF_c$ species also produce polymers having weaker polymer adhesion force to silicon substrate than the polymer formed by $cC_4F_8$, which may make the polymer easier to remove from the aperture.

As shown in the examples, initial test results indicate that increasing the amount of H in the $C_xH_yF_z$ hydrogen-containing polymer deposition fluid, with $1 \leq x < 7$, $1 \leq y \leq 13$, and $1 \leq z \leq 13$, permits similar etching rates notwithstanding the width or desired aspect ratio of the aperture to be etched. In other words, if the aperture has a 2 nm or a 20 nm or a 100 nm width and will have a high aspect ratio (10-50), the etching rates will be similar when using a hydrogen-containing polymer deposition fluid having more hydrogen than the standard $cC_4F_8$ Bosch polymer deposition gas.

As the disclosed hydrogen-containing polymer deposition fluids permit the etch rate to become more consistent notwithstanding the size of the aperture, the disclosed process may permit deep aperture silicon etching without the use of a stop layer. In addition to reducing processing costs and time associated with deposition of the stop layer, removal of the need for a stop layer using the disclosed hydrogen-containing polymer deposition fluids may also prevent any notching at the interface of the stop layer and Si layer.

The vapor of the etching fluid is introduced into a plasma reaction chamber having the substrate to be etched contained therein. The introduction time may range from approximately 0.001 seconds to approximately 30 seconds. The vapor of the hydrogen-containing polymer deposition fluid is subsequently introduced into the reaction chamber. The introduction time may range from approximately 0.001 seconds to approximately 30 seconds. The introduction time of the etching fluid is always longer than that of the hydrogen-containing polymer deposition fluid. The plasma etching and polymer deposition steps are repeated until the aperture has the desired aspect ratio. The resulting aperture may have an aspect ratio ranging from approximately 2:1 to approximately 100:1 and a width ranging from approximately 10 nm to approximately 2000 um (microns or micrometers). The length may range from 10 nm to 450 mm.

The etching methods occur in a plasma reaction chamber having a substrate disposed therein. The plasma reaction chamber may be any enclosure or chamber within a device in which etching methods take place such as, and without limitation, Reactive Ion Etching (RIE), Dual Capacitively Coupled Plasma (CCP) with single or multiple frequency RF sources, Inductively Coupled Plasma-Reactive Ion Etching (ICP-RIE), Microwave Plasma reactors, Magnetic Enhanced Reactive Ion Etching (MERIE) or other types of etching systems capable of selectively removing a portion of the Si containing layer or generating active species. One of ordinary skill in the art will recognize that the different plasma reaction chamber designs provide different electron temperature control. Suitable commercially available plasma reaction chambers include but are not limited to the Applied Materials etcher sold under the trademark Centura Silvia™ or the Lam Research etcher product family sold under the trademark 2300® Syndion™.

The plasma reaction chamber may contain one or more than one substrate. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silicon carbide, silica, glass, GaAs, or GaN wafers. For example, the plasma reaction chamber may contain from 1 to 200 silicon wafers having from 25.4 mm to 450 mm diameters. The wafer may have one or more layers of differing materials deposited on it from a previous manufacturing step. For example, the wafers may include silicon layers (crystalline, amorphous, porous, etc.), silicon carbide layers, silicon oxide layers, silicon nitride layers, silicon oxy nitride layers, carbon doped silicon oxide (SiCOH) layers, or combination thereof. Additionally, the wafers may include GaN layers, aluminum layers, copper layers, tungsten layers, or noble metal layers (e.g., platinum, palladium rhodium, or gold). Plastic layers, such as poly(3,4-ethylenedioxythiophene)poly (styrenesulfonate) [PEDOT:PSS], may also be used. The layers may be planar or patterned. The disclosed processes may etch the aperture directly on the wafer or directly on one or more than one (when patterned layers from the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a Si layer may be deposited onto a $SiO_2$ layer. In subsequent processing, a TiN mask layer may be deposited on portions of the Si layer, which may then be etched by the methods disclosed herein.

The gas form of the disclosed etching fluids and hydrogen-containing polymer deposition fluids are introduced into the plasma reaction chamber. Each of the fluids may be introduced to the chamber at a flow rate ranging from approximately 0.1 sccm to approximately 1 slm. For example, for a 200 mm wafer size, each of the fluids may be introduced to the chamber at a flow rate ranging from approximately 50 sccm to approximately 200 sccm. Alternatively, for a 450 mm wafer size, each of the fluids may be introduced to the chamber at a flow rate ranging from approximately 100 sccm to approximately 2000 sccm. One of ordinary skill in the art will recognize that the flow rate will vary from tool to tool. In one alternative, the hydrogen-containing polymer deposition fluid and the etching fluid are separately introduced into chamber. In another alternative, the hydrogen-containing polymer deposition fluid continuously flows into chamber and the etching fluid is pulsed introduced into chamber.

Some of the etching fluids and hydrogen-containing polymer deposition fluids are gaseous at room temperature and atmospheric pressure. For the non-gaseous (i.e., liquid) compounds, the gas form may be produced by vaporizing the compounds through a conventional vaporization step, such as direct vaporization or by bubbling. The compound may be fed in liquid state to a vaporizer where it is vaporized before it is introduced into the reactor. Alternatively, the compound may be vaporized by passing a carrier gas into a container containing the compound or by bubbling the carrier gas into the compound. The carrier gas may include, but is not limited to, Ar, He, $N_2$, and mixtures thereof. Bubbling with a carrier gas may also remove any dissolved oxygen present in the etching gases. The carrier gas and compound are then introduced into the reactor as a vapor.

If necessary, the containers containing each of the etching fluids and hydrogen-containing polymer deposition fluids may be heated to a temperature that permits the compound to have a sufficient vapor pressure for delivery into the etching tool. The container may be maintained at temperatures in the range of, for example, approximately 25° C. to approximately 100° C., preferably from approximately 25° C. to approximately 50° C. More preferably, the container is maintained at room temperature (~25° C.) in order to avoid heating the lines to the etch tool. Those skilled in the art recognize that the temperature of the container may be adjusted in a known manner to control the amount of compound vaporized.

Depending on the plasma reaction chamber used, an inert gas may also be introduced into the plasma reaction chamber with the etching fluid and/or the hydrogen-containing polymer deposition fluid in order to provide better ion bombardment. In other alternatives, no inert gas is necessary because the energy generating the plasma and the flow rate of the etching fluid and/or the hydrogen-containing polymer deposition fluid are sufficient to sustain the plasma without the added assistance of an inert gas. When an inert gas is necessary, the inert gas may be He, Ar, Xe, Kr, Ne, or combinations thereof. The inert gas may be mixed with the etching fluid or hydrogen-containing polymer deposition fluid prior to introduction to the chamber, with the inert gas comprising between approximately 0% v/v and approximately 95% v/v of the resulting mixture. Alternatively, the hydrogen-containing polymer deposition fluid may be introduced to the chamber continuously while the etching fluid and inert gas are introduced to the chamber in pulses.

The disclosed etching fluid and the hydrogen-containing polymer deposition fluid are activated by plasma to produce activated species. The plasma decomposes the etching fluid and hydrogen-containing polymer deposition fluid into radical form (i.e., the activated etching fluid or the activated hydrogen-containing polymer deposition fluid (previously referred to as the $C_aH_bF_c$ species)). The plasma may be generated by applying RF or DC power. The plasma may be generated with a RF power ranging from about 25 W to about 10,000 W. The plasma may be generated or present within the reactor itself. The plasma may be generated in Dual CCP or ICP mode with RF applied at both electrodes. RF frequency of plasma may range from 200 KHz to 1 GHz. Different RF sources at different frequency can be coupled and applied at same electrode. Plasma RF pulsing may be further used to control molecule fragmentation and reaction at substrate. One of skill in the art will recognize methods and apparatus suitable for such plasma treatment.

Quadropole mass spectrometer (QMS), optical emission spectrometer, FTIR, or other radical/ion measurement tools may measure the activated etching fluid or the activated hydrogen-containing polymer deposition fluid to determine the types and numbers of species produced. If necessary, the flow rates of the etching fluid, the hydrogen-containing polymer deposition fluid, and/or the inert gas may be adjusted to increase or decrease the number of radical species produced.

The disclosed etching fluid may be mixed with other gases either prior to introduction into the plasma reaction chamber or inside the plasma reaction chamber. Exemplary gases include, without limitation, oxidizers such as $O_2$, $O_3$, CO, $CO_2$, NO, $N_2O$, $NO_2$, and combinations thereof. As disclosed in WO2014/070838, etching of silicon-containing substrates occurs from the combination of an oxygen-containing gas with the disclosed hydrogen-containing polymer deposition fluid. Therefore, the disclosed hydrogen-containing polymer deposition fluid should not be mixed with an oxygen-containing gas to perform the Bosch-type etching methods disclosed herein. The disclosed etching fluid and the oxidizer may be mixed together prior to introduction into the plasma reaction chamber. Alternatively, the oxidizer may be introduced continuously into the chamber and the etching fluid introduced into the chamber in pulses. The oxidizer may comprise between approximately 5% v/v to approximately 100% v/v of the mixture introduced into the chamber (with 100% v/v representing introduction of pure oxidizer for the continuous introduction alternative).

Other exemplary gases with which the etching fluid and/or the hydrogen-containing polymer deposition fluid may be mixed include additional etching gases, such as $cC_4F_8$, $C_4F_6$, $CF_4$, $CHF_3$, $CF_3H$, $CH_2F_2$, COS, $CS_2$, $CF_3I$, $C_2F_3I$, $C_2F_5I$, and $SO_2$, before or after introduction into the plasma reaction chamber. The additional etching gases may comprise between approximately 1% v/v to approximately 99.9% v/v of the mixture introduced into the chamber.

The Si-containing layers and the activated etching fluid react to form volatile by-products that are removed from the plasma reaction chamber. The disclosed etching processes selectively etch the silicon layers more than SiO layers, SiN layers, amorphous carbon masks, antireflective coatings, and photoresist layers.

The temperature and the pressure within the plasma reaction chamber are held at conditions suitable for the silicon-containing layer to react with the activated etching fluid. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, and more preferably between approximately 10 mTorr and approximately 100 mTorr, as required by the etching parameters. Likewise, the substrate temperature in the chamber may range between about approximately −196° C. to approximately 500° C., preferably between −120° C. to approximately 300° C., and more preferably between 5° C. to approximately 30° C. Chamber wall temperatures may range from approximately −196° C. to approximately 300° C. depending on the process requirements, preferably between 100° C. to 250° C.

The reactions between the Si-containing layer and the activated etching fluid results in anisotropic removal of the Si-containing layers from the substrate. Atoms of nitrogen, oxygen, and/or carbon may also be present in the Si-containing layer. The removal is due to a physical sputtering of Si-containing layer from plasma ions (accelerated by the plasma) and/or by chemical reaction of plasma species to convert Si to volatile species, such as $SiF_x$, wherein x ranges from 1-4.

In one non-limiting exemplary plasma etch process, $SF_6$ and trans-1,1,2,2,3,4-Hexafluorocyclobutane are independently introduced into a 200 mm ICP-RIE plasma etch tool using controlled gas flow devices. The controlled gas flow devices may be mass flow controllers. The plasma reaction chamber contains a substrate having a 5 um photo resist mask over a 0.4 mm Si layer. The substrate temperature is kept at 20° C. The pressure of the plasma reaction chamber is set at approximately 45 mbar. The trans-1,1,2,2,3,4-hexafluorocyclobutane source is heated to between 40° C. to 50° C. in order to keep a high vapor pressure, as the boiling point of this compound is approximately 27° C. The distance from the substrate to the plasma source is kept at 10 cm and the top electrode RF power is fixed at 1800 W. The low frequency RF power of the bottom electrode is set as 100 W with 10 ms turn on and 90 ms turn off during the $SF_6$ etching process. $SF_6$ is introduced into the chamber at 300 sccm for 7 seconds as etching step to etch the silicon layer. The low frequency RF power of the bottom electrode is set as 0 W during the trans-1,1,2,2,3,4-Hexafluorocyclobutane polymer deposition process. Trans-1,1,2,2,3,4-Hexafluorocyclobutane is introduced into the chamber at 150 sccm for 2 seconds as polymer formation step. The cycle is repeated with subsequent $SF_6$ cycles removing both the bottom polymer film formed from the trans-1,1,2,2,3,4-hexafluorocyclobutane as well as the Si layer.

The processes disclose hydrogen-containing polymer deposition fluids that produce smaller species capable of forming polymers in deep etch apertures, permitting etching of future generation TSV, MEMS, and power devices. The deposited polymers may also be easier to remove from the aperture than those produced by $cC_4F_8$.

The disclosed processes may also reduce RIE lag (or eliminate the difference in etch rate of different open masks) in deep silicon etching during the manufacture of TSV, MEMS, and power devices. As a result, the hydrogen-containing polymer deposition fluids may be used without requiring complex process parameter optimization for each device.

EXAMPLES

The following non-limiting examples are provided to further illustrate embodiments of the invention. However, the examples are not intended to be all inclusive and are not intended to limit the scope of the inventions described herein.

The following testing was performed using a reactive ion etcher (RIE) or an ICP-RIE etcher similar to the device shown in FIG. 1.

Example 1

Figure 2:
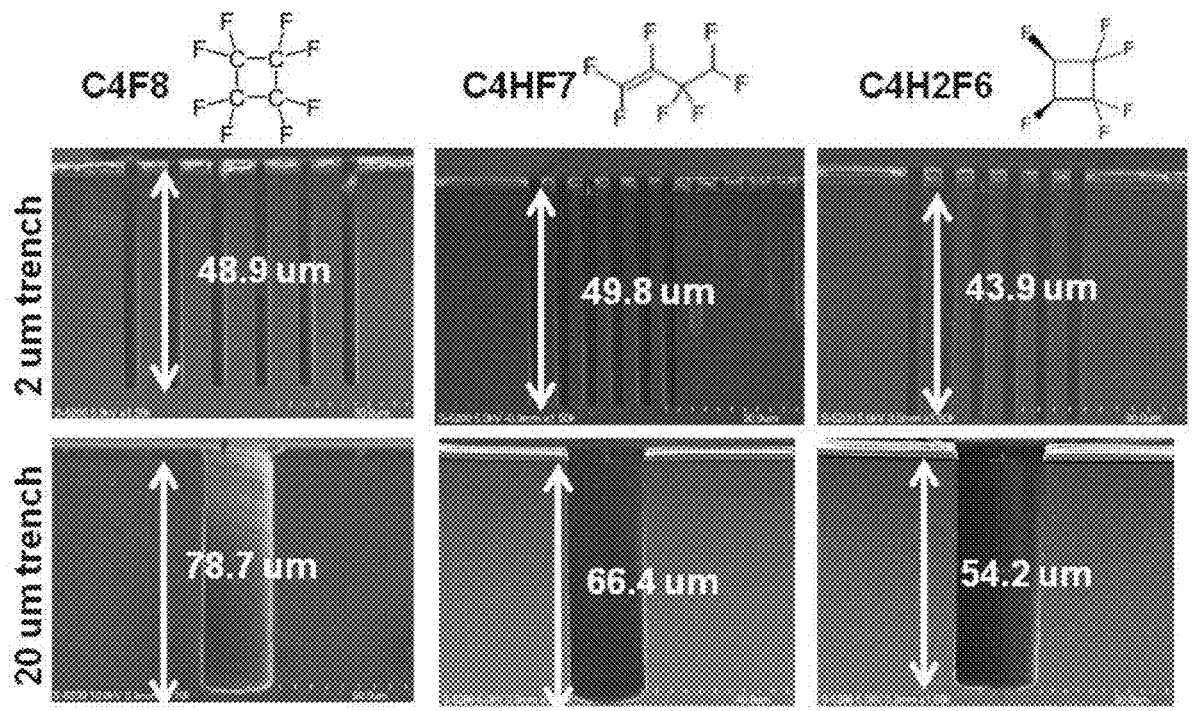
FIG. 2 are scanning electron microscope (SEM) images of aperatures (with different widths 2 um or 20 um) etched by $SF_6$ followed by the specified hydrogen-containing polymer deposition fluid. Arrows in each image indicate the height of the aperture. The etching time is 10 minutes for each experiment.

Six deep trenches, three having a 2 micron width and three having a 20 micron width, were created using $SF_6$ and 3 different polymer formation fluids ($cC_4F_8$, $C_4HF_7$ and $C_4H_2F_6$). The ICP power was 1800 W, the bias low frequency power was 100 W with 10 ms turn on and 90 ms turn off, the pressure was 45 mbar, the flow rate for $SF_6$ was 300 sccm for 7 seconds and the flow rate for polymer formation fluid was 150 sccm for 2 seconds, the temperature of substrate was 20° C., and the total process time was 10 minutes. Scanning Electron Microscope (SEM) photographs of the results are shown in FIG. 2.

Figure 3:
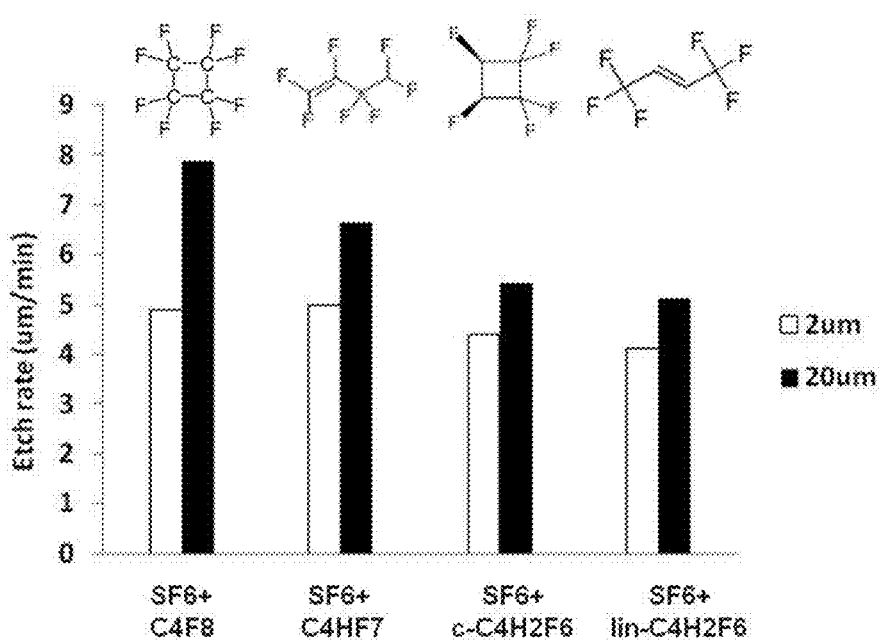
FIG. 3 is a graph illustrating the Bosch etching rate of different apertures by using $SF_6$ followed by the four specified $C_4H_yF_z$ hydrogen-containing polymer deposition fluids, wherein y is 0-2 and z is 8-6.
Figure 4:
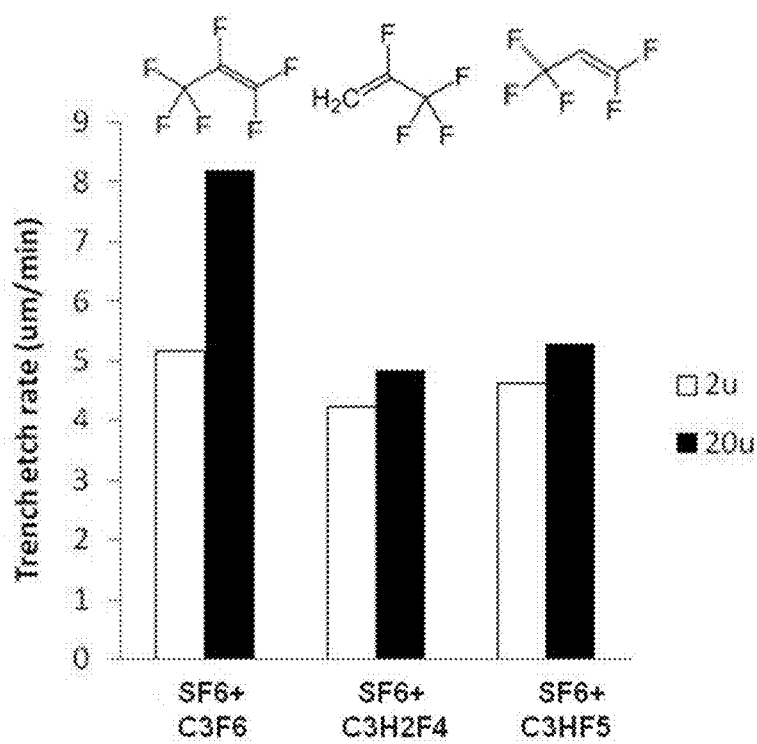
FIG. 4 is a graph illustrating the Bosch etching rate of different apertures by using $SF_6$ followed by the three specified $C_3H_yF_z$ hydrogen-containing polymer deposition fluids, wherein y is 0-2 and z is 6-4.

FIG. 3 shows the different etch rates of four $C_4H_yF_z$ fluids combinations (i.e., $SF_6/cC_4F_8$, $SF_6/C_4HF_7$, $SF_6/c\text{-}C_4H_2F_6$, $SF_6/\text{lin-}C_4H_2F_6$) for each width. $SF_6/C_4H_yF_z$ means that $SF_6$ was used in a etch step and $C_4H_yF_z$ (wherein y=0, 1, or 2; z=6, 7, or 8; and y+z=8) was used in a polymer deposition step. As can be seen, the difference in etch rates between the small (2 micron) and large (20 micron) trenches decreases with increasing hydrogen content of molecule FIG. 4 shows the different etch rates of three $C_3H_yF_z$ fluids combinations (i.e., $SF_6/C_3F_6$, $SF_6/C_3H_2F_4$, $SF_6/C_3HF_5$) for each width. $SF_6/C_3H_yF_z$ (wherein y=0, 1, or 2; z=4, 5, or 6; and y+z=6) means $SF_6$ was used in a etch step and $C_3H_yF_z$ was used in a polymer deposition step. As can be seen, the difference in etch rates between the small (2 micron) and large (20 micron) trenches decreases with increasing hydrogen content of molecule, especially for the molecule containing $=CH_2$.

Example 2

The polymer deposition and etch rates were evaluated as follows:

(1) creating uniform trenches using they cyclic Bosch process by etching using $SF_6$ and depositing a polymer with $cC_4F_8$, thereby producing trenches having the same depth. The parameters used for creating trenches were: ICP power was 1800 W, the bias low frequency power was 100 W with 10 ms turn on and 90 ms turn off, the pressure was 45 mbar, the flow rate for $SF_6$ was 300 sccm for 7 seconds and the flow rate for $cC_4F_8$ was 150 sccm for 2 seconds, the temperature of substrate was kept at 20° C., the total process time was 10 minutes.

(2) depositing the polymer by introducing the plasma of each fluid ($cC_4F_8$, $C_3F_6$, $C_3H_2F_4$, $C_3HF_5$, $C_4HF_7$, $C_4H_2F_6$, or $cC_4H_2F_6$) into the trench and measuring the polymer thickness by SEM. The deposition conditions were the same for each fluid: ICP power was 1800 W, no bias power applied, the pressure was 45 mbar, the flow rate for each fluid was 150 sccm for 3 minutes, the temperature of substrate was kept at 20° C.

(3) etching the deposited polymer film by $SF_6$ at the same condition and measured thickness by SEM. The difference in thickness before and after etching is the polymer etch resistance. The parameters for etching were: ICP power was 1800 W, the bias low frequency power was 100 W with 10 ms turn on and 90 ms turn off, the pressure was 45 mbar, the flow rate for $SF_6$ was 300 sccm for 1 minute, the temperature of substrate was kept at 20° C.

Figure 5:
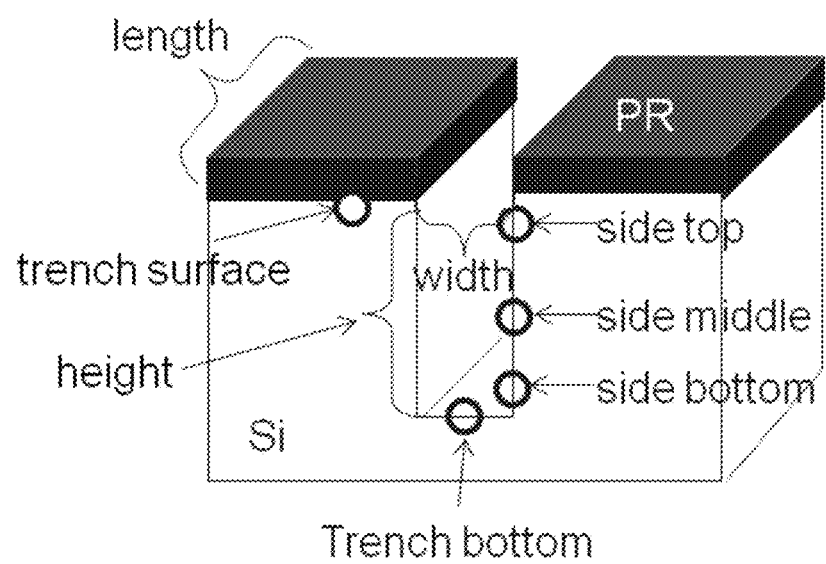
FIG. 5 is a perspective diagram of an aperture used for the evaluation of polymer deposition rates and etch resistance.
Figure 6A:
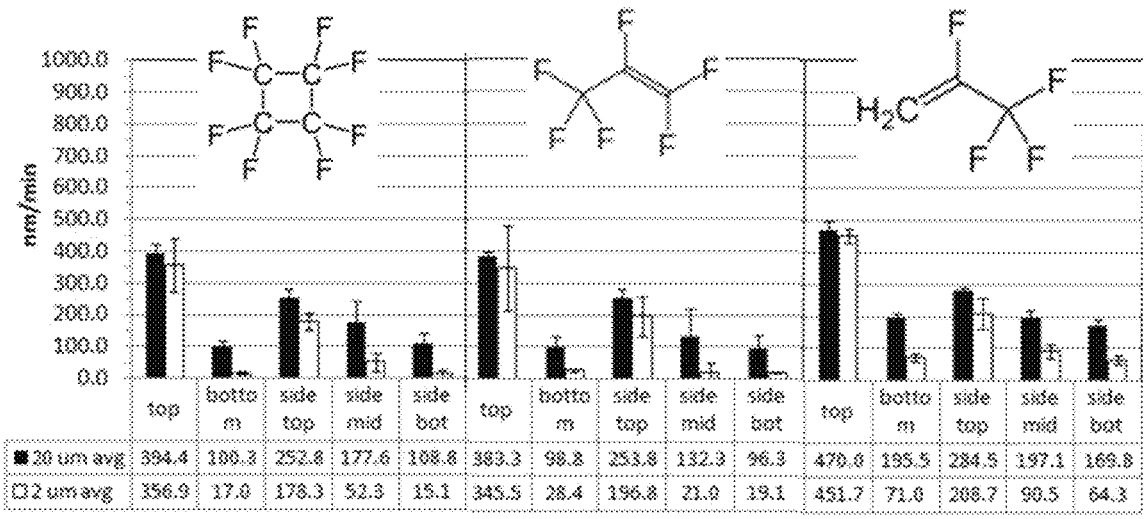
FIG. 6a are graphs of the deposition rates of polymer films in the pre-created apertures of FIG. 5.
Figure 6A:
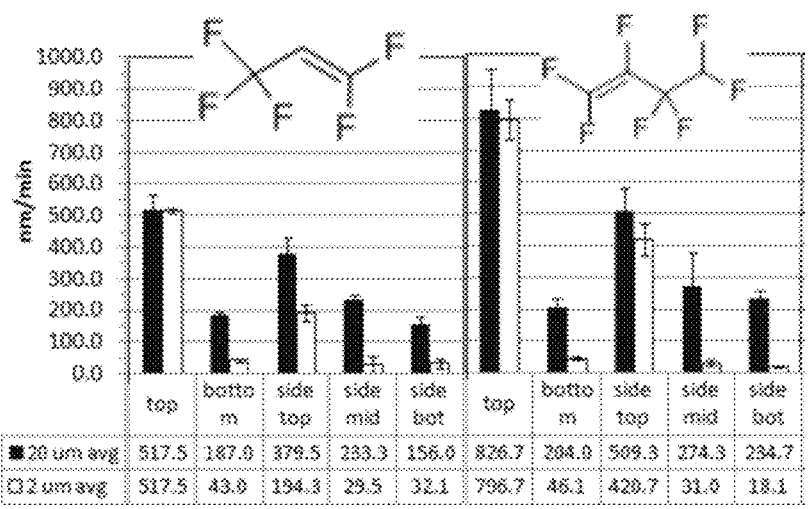
Figure 6A:
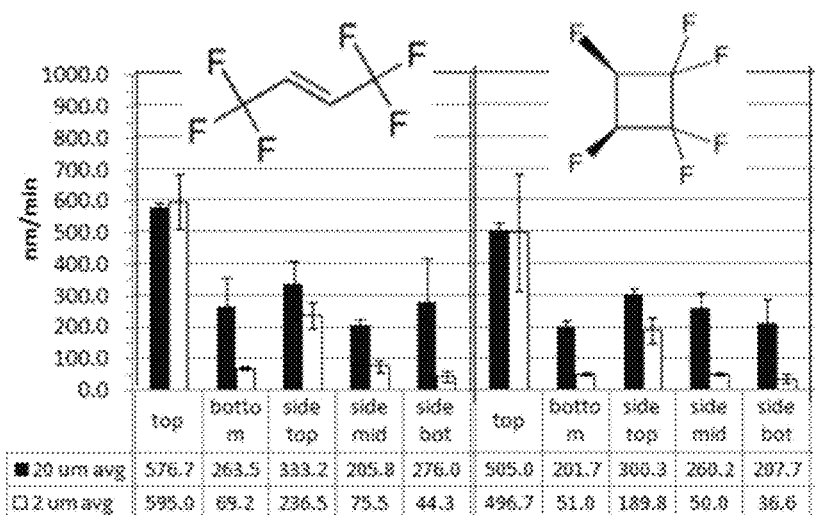
Figure 6B:
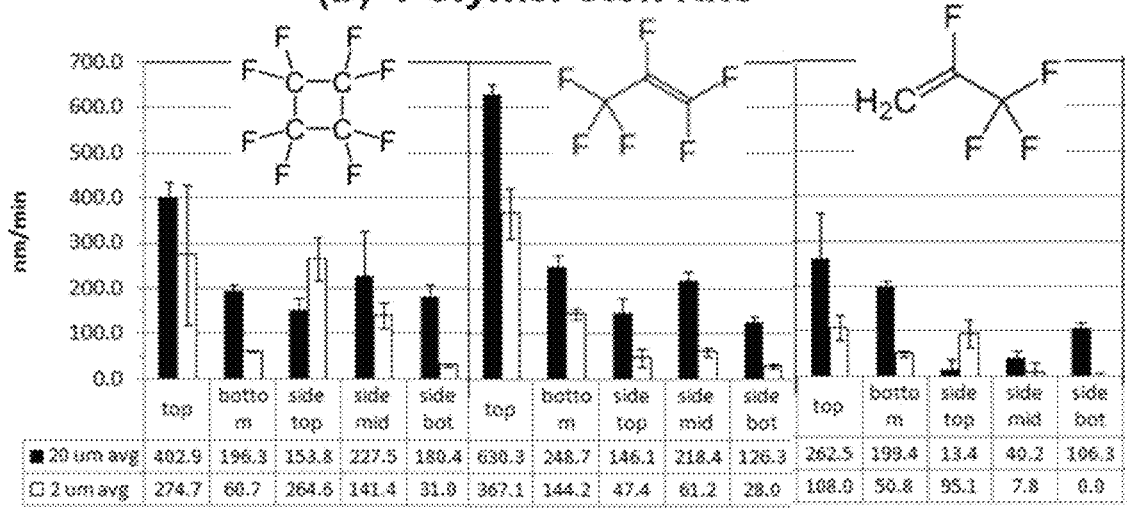
FIG. 6b are graphs of the etch resistances of the polymer films deposited in FIG. 6a. The etch resistance was determined using $SF_6$ as the etching gas.
Figure 6B:
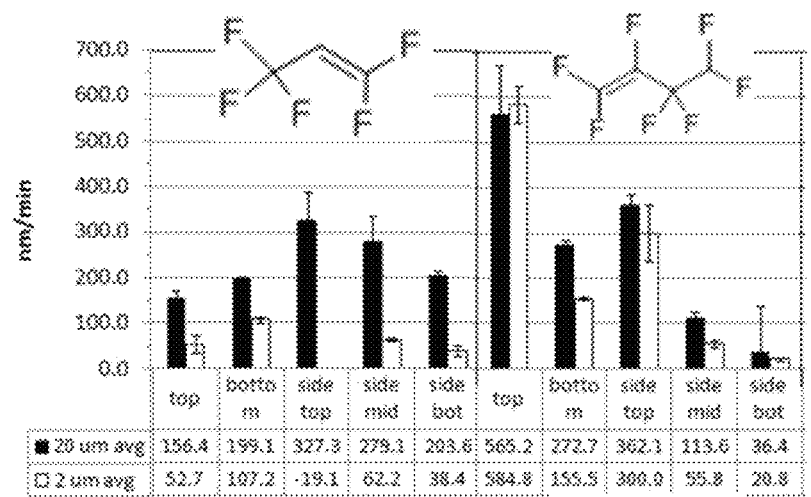
Figure 6B:
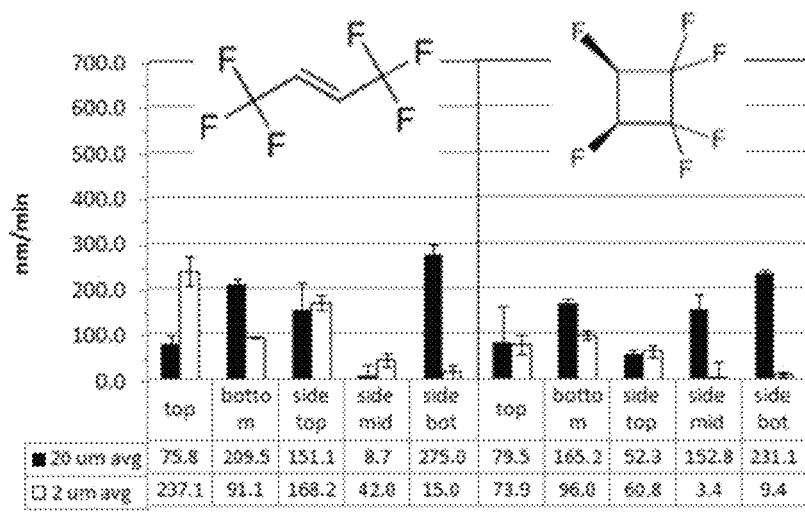
Figure 7:
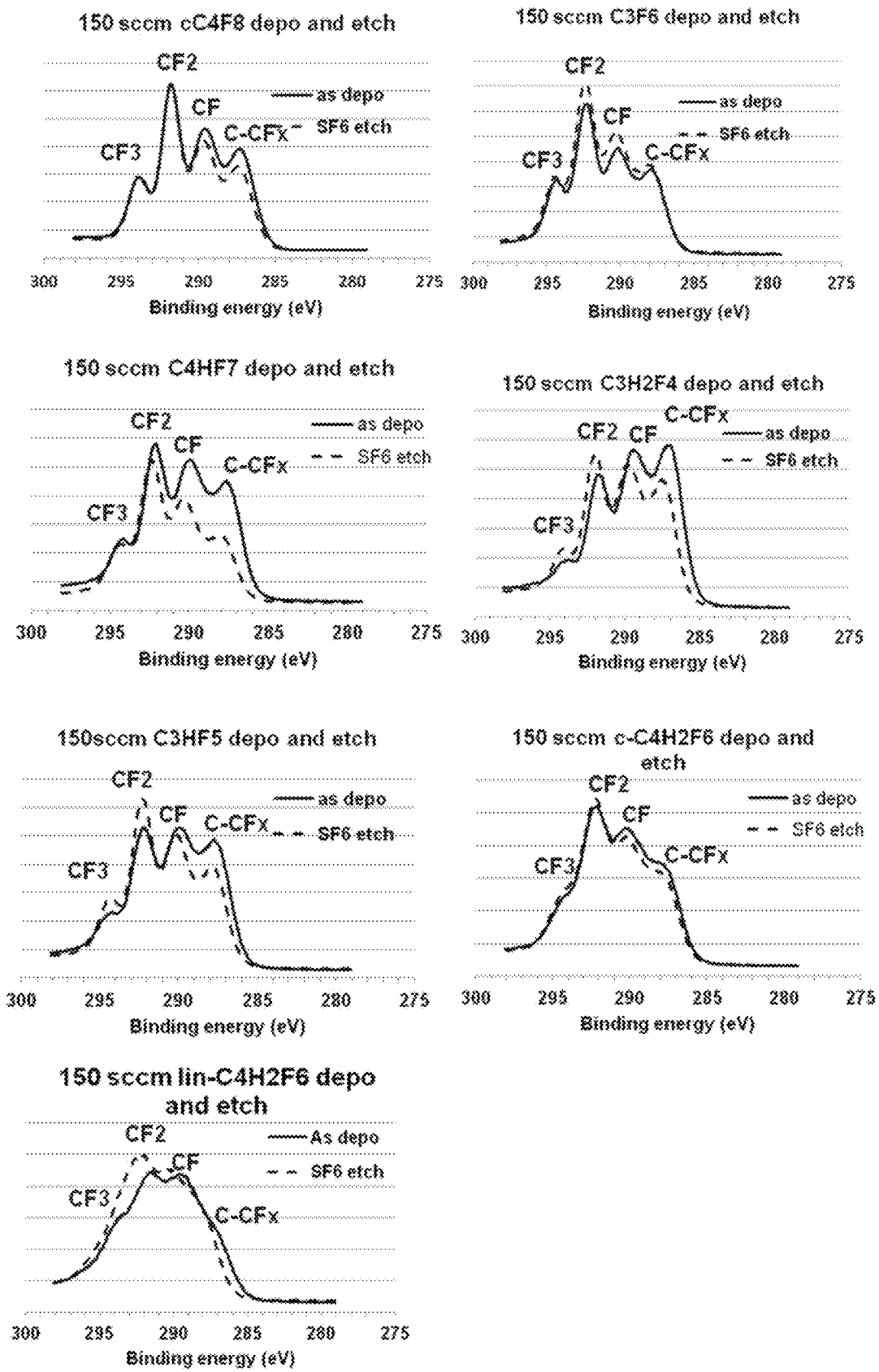
FIG. 7 are XPS graphs of the compositions of polymer film as deposited in FIG. 6a and after etching in FIG. 6b.

The thickness of polymer films in steps (2) and (3) were measured at different points of the trenches, which were trench top surface, trench bottom, top of trench sidewall, middle of trench sidewall and bottom of trench sidewall, as shown in FIG. 5. FIG. 6a shows the polymer deposition rates obtained in step 2. FIG. 6b shows the polymer etch resistance of the polymer films deposited in FIG. 6a obtained in step 3. FIG. 7 shows polymer composition analysis by X-ray Photoelectron Spectroscopy (XPS). The polymer film was analyzed on top surface of substrate because it is difficult for the XPS to perform analysis in the narrow trench. The larger amount of C—$CF_x$ (x=1~3) means the film has higher carbon concentration which is more densely packed in geometry and also difficult to be etched by $SF_6$. Such densely packed film is expected to show higher $SF_6$ etch resistivity.

Example 3

FIG. 8 shows Quadrapole Mass Spectrometer (Q-MS) analysis of each fluid. The measurement was done by flowing fluid into Q-MS analyzer chamber, where an ionization energy of 70 eV was imposed. $C_4HF_7$, $c\text{-}C_4H_2F_6$, $lin\text{-}C_4H_2F_6$, and $C_3HF_5$ contain a lot of high C:F ratio species (high C:F ratio here means C:F≥1:2, e.g., C>1 when F=2), those species are important to form dense polymer film which show higher etch resistance. Q-MS was not performed on $C_3H_2F_4$ due to the poor results obtained in Example 2.

Example 4

Figure 9:
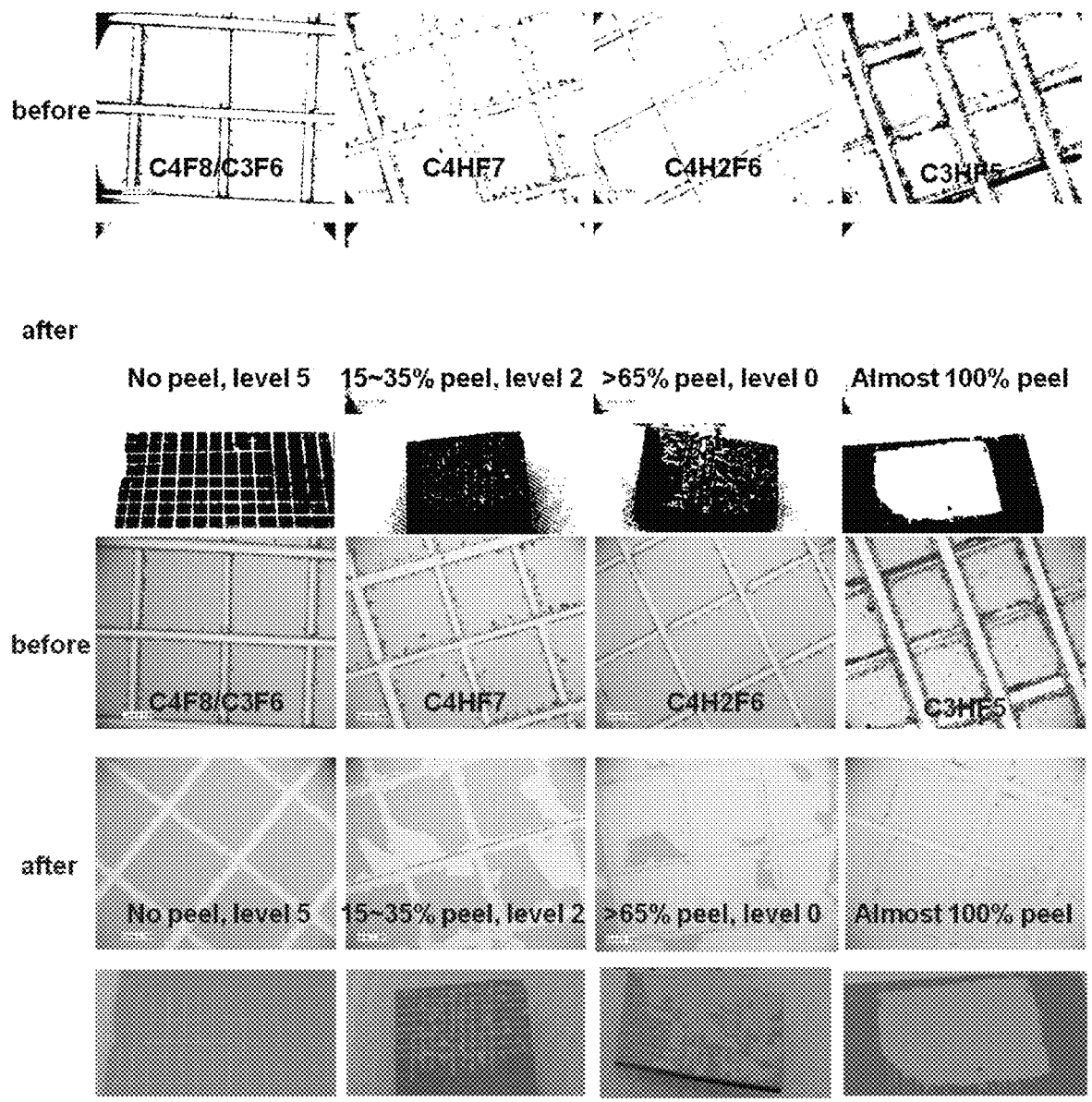
FIG. 9 are pictures of the peel test results of polymer film deposited on a substrate. The peel test was done by ASTM D3359.

The adhesion forces of polymer films to blank silicon wafers were evaluated. The ASTM D3359 tape peeling test was used as the standard for evaluation. 3M brand 610 tape was used for peel test. Polymer film was cross cut by 1 mm×1 mm. After peeling by tape, the area of removed polymer was evaluated by optical microscope image. FIG. 9 shows optical microscope images of polymer film before and after peeling test. The pictures in the bottom line are taken by camera to show low magnification image. The adhesion forces decrease with higher hydrogen content having the same carbon number.

Example 5

In addition to the range of trench size from 2 micron to 20 micron, we also tested a larger trench size up to 2 millimeter. The trend of RIE lag reduction is same as we observed from 2 micron to 20 micron.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for producing apertures having different aspect ratios, the method comprising the steps of:
    a) forming an aperture having one width and an aperture having a different width in a silicon-containing substrate by plasma etching the silicon-containing substrate with an etching fluid containing fluorine to form an etched silicon-containing substrate;
    b) depositing a polymer film on the etched silicon-containing substrate by plasma-treating an unsaturated hydrogen-containing polymer deposition fluid selected from the group consisting of (Z)-1,1,1,4,4,4-hexafluoro-2-butene, (E)-1,1,1,4,4,4-hexafluoro-2-butene, trans-1,1,2,2,3,4-hexafluorocyclobutane, and hexafluoroisobutene; and
    c) repeating steps a) and b) to produce at similar rates an etched and polymer deposited silicon-containing substrate having an aperture having a high aspect ratio and an aperture having a low aspect ratio;
    wherein the aperture having the high aspect ratio has an aspect ratio >15:1 and the aperture having the low aspect ratio has an aspect ratio <5:1.

2. The method of claim 1, wherein an aspect ratio for the aperture having the high aspect ratio and the aperture having the low aspect ratio ranges from approximately 2:1 to approximately 100:1.

3. The method of claim 1, wherein the silicon-containing substrate is silicon.

4. The method of claim 1, wherein the silicon-containing substrate is silicon carbide.

5. The method of claim 1, wherein the etching fluid is selected from the group consisting of $SF_6$, $SF_5CF_3$, $SF_4$, $PF_3$, $Si_2F_6$, $BF_3$, $CF_3I$, $C_2F_5I$, $C_3F_7I$, $SOF_4$, $IF_5$, and $COF_2$.

6. The method of claim 5, wherein the etching fluid is selected from the group consisting of $SF_6$, $SF_4$, $PF_3$, $Si_2F_6$, $BF_3$, $SOF_4$ and $IF_5$.

7. The method of claim 1, wherein a width of the aperture having the high aspect ratio and the aperture having the low aspect ratio ranges from approximately 40 nm to approximately 2000 μm (microns or micrometers).

8. The method of claim 1, wherein the plasma etching process selectively etches silicon more than silicon oxide.

9. The method of claim 1, wherein the plasma etching process selectively etches silicon more than silicon nitride.

10. The method of claim 1, wherein an inert gas is utilized.

11. The method of claim 1, wherein an oxygen-containing gas is utilized.

12. The method of claim 1, wherein an inert gas is not utilized.

13. The method of claim 1, wherein an oxygen-containing gas is not utilized.

14. The method of claim 1, wherein the unsaturated hydrogen-containing polymer deposition fluid is (Z)-1,1,1,4,4,4-hexafluoro-2-butene.

15. The method of claim 1, wherein the unsaturated hydrogen-containing polymer deposition fluid is (E)-1,1,1,4,4,4-hexafluoro-2-butene.

16. The method of claim 1, wherein the unsaturated hydrogen-containing polymer deposition fluid is trans-1,1,2,2,3,4-hexafluorocyclobutane.

17. The method of claim 1, wherein the unsaturated hydrogen-containing polymer deposition fluid is hexafluoroisobutene.

* * * * *